(12) United States Patent
Mutter et al.

(10) Patent No.: US 11,403,249 B2
(45) Date of Patent: *Aug. 2, 2022

(54) CIRCUIT FOR A BUS SYSTEM AND METHOD FOR OPERATING A CIRCUIT

(71) Applicant: Robert Bosch GmbH, Stuttgart (DE)

(72) Inventors: Arthur Mutter, Neuhausen (DE); Steffen Walker, Reutlingen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

This patent is subject to a terminal disclaimer.

(21) Appl. No.: 17/040,627

(22) PCT Filed: May 7, 2019

(86) PCT No.: PCT/IB2019/053740
§ 371 (c)(1),
(2) Date: Sep. 23, 2020

(87) PCT Pub. No.: WO2019/211824
PCT Pub. Date: Nov. 7, 2019

(65) Prior Publication Data
US 2021/0117362 A1    Apr. 22, 2021

(30) Foreign Application Priority Data
May 4, 2018   (DE) .......................... 102018206927.1

(51) Int. Cl.
*G06F 13/40* (2006.01)
*H03K 5/08* (2006.01)

(52) U.S. Cl.
CPC .......... *G06F 13/4068* (2013.01); *H03K 5/08* (2013.01)

(58) Field of Classification Search
CPC ............ G06F 13/4068; G06F 13/4086; H04L 12/40013; H04L 25/0264; H04L 2012/40215
See application file for complete search history.

(56) References Cited

U.S. PATENT DOCUMENTS

| 6,522,689 B1 * | 2/2003 | Heinrich ........... H04L 12/40032 375/224 |
| 2009/0086865 A1 * | 4/2009 | Drapkin ................ H04L 25/085 375/350 |

(Continued)

FOREIGN PATENT DOCUMENTS

| DE | 102015214399 A1 | 2/2016 |
| DE | 102015222334 A1 | 5/2017 |

(Continued)

OTHER PUBLICATIONS

International Search Report for PCT/IB2019/053740, dated Oct. 7, 2019.

(Continued)

*Primary Examiner* — Ernest Unelus
*Assistant Examiner* — Ronald T Modo
(74) *Attorney, Agent, or Firm* — Norton Rose Fulbright US LLP; Gerard Messina

(57) ABSTRACT

A circuit for a bus system is provided. The circuit includes: an ascertainment circuit, which is configured to ascertain a first state in which an absolute difference of a voltage between two bus-side terminals is above a threshold value, to ascertain a second state in which the absolute difference of the voltage between the two bus-side terminals is below a threshold value, to ascertain a bit boundary as a function of a number of state transitions between the first and second state, and a suppression circuit, which is configured to (Continued)

connect a suppression circuit between the two bus-side terminals before the bit boundary.

24 Claims, 4 Drawing Sheets

(56) References Cited

U.S. PATENT DOCUMENTS

2012/0293230 A1* 11/2012 Mori ................... H04L 25/026
                                                              327/313
2018/0260353 A1     9/2018 de Haas et al.

FOREIGN PATENT DOCUMENTS

| | | |
|---|---|---|
| JP | 2017158180 A | 9/2017 |
| JP | 2018164221 A | 10/2018 |
| JP | 2018182431 A | 11/2018 |

OTHER PUBLICATIONS

Robert Bosch GmbH, "Can Specification, Version 2.0," Bosch Can Specification Version 2.0, 1991, pp. 1-72.

* cited by examiner

CIRCUIT FOR A BUS SYSTEM AND METHOD FOR OPERATING A CIRCUIT

FIELD

The present invention relates to a circuit for a bus system and to a method for operating a circuit for a bus system.

BACKGROUND INFORMATION

Prolonged oscillations of a bus voltage of a bus system resulting from improper termination or from an improper topology of the bus system are known to be key factors, which may result in an error-prone data transmission. A reduction of the bit time due to increased transmission rates, in particular, is problematic in this case.

To compensate for the oscillations of the voltage, German Patent Application No. DE 10 2015 222 334 A1 describes that bus oscillations may be selectively masked when receiving data. A masking element is provided for masking oscillations of the bus signal for a predetermined masking time if a monitoring result indicates that a difference of the bus signal after a transition of the bus signal from a dominant to a recessive state exceed at least one predefined threshold value.

SUMMARY

The problems of the related art may solved by a circuit and by a method in accordance with example embodiments of the present invention. Advantageous refinements and example embodiment of the present invention are described herein.

According to one first aspect of the present invention, a circuit for a bus system is provided. In accordance with an example embodiment of the present invention, the circuit includes an ascertainment circuit, which is configured to ascertain a first state in which an absolute difference of a voltage between two bus-side terminals is above a threshold value, to ascertain a second state in which the absolute difference of the voltage between the two bus-side terminals is below the threshold value, and to ascertain a bit boundary as a function of a number of state transitions between the first and second state. The circuit also includes a suppression circuit, which is switchable between the two bus-side terminals before the ascertained bit boundary.

The suppression circuit is advantageously preventively connected in a time window in which the probability of the occurrence of the state transition is high. This yields the advantage that an erroneous activation of the suppression circuit is prevented. Short-term signal interferences, which could be erroneously classified as a state transition, are advantageously masked. The robustness of the communication is increased as a result.

The circuit with a CAN bus system is advantageous, in particular, since the state transition of the differential signal from dominant to recessive—taking the signal propagation times and delays in the bus system into account—is expected only around the bit boundary and starting from the dominant state of the differential signal.

In one advantageous specific embodiment of the present invention, the ascertainment circuit is configured to ascertain at least one time window, the start of which is situated before the bit boundary and the end of which is situated after the bit boundary, and that the suppression circuit is connectable at the start of the time window between the two bus-side terminals and is disconnectable at the end of the time window. The connection of the suppression circuit is advantageously excluded outside the time window in order, for example, not to cause any unnecessary reduction in the total resistance in the CAN bus system in the event the suppression circuit is designed with a resistor.

The suppression circuit is advantageously configured to increase an attenuation of an oscillation of the voltage between two bus-side terminals when a state transition from the first state into the second state occurs, in particular, within the ascertained time window.

In one advantageous specific embodiment of the present invention, the suppression circuit is configured to be connected with at least two different impedance values between the two bus-side terminals, and to then lower the impedance value of the connected suppression circuit when a state transition from the first state into the second state occurs within the ascertained time window. The ascertainment of the actual state change is advantageously used to lower the impedance value of the already connected suppression circuit in such a way that a sufficient attenuation of the oscillation of the differential signal to be expected is achieved. In addition, an unnecessarily high reduction of the total impedance at the bus system is avoided if no state transition occurs.

In one advantageous specific embodiment of the present invention, the suppression circuit is configured to hold the impedance value constant until the ascertainment of the state transition. In this way, it is advantageously possible to pre-attenuate an already incipient oscillation before the impedance value is lowered. On the other hand—should no state transition occur—no unnecessary reduction of the total impedance of the bus system is caused.

In one alternative specific embodiment of the present invention, the suppression circuit is configured to lower the impedance value over time until the ascertainment of the state transition. Since the probability of occurrence of the state transition within the time window—in particular, after the ascertained bit boundary—increases, a continuous reduction of the impedance value, in particular, may improve the attenuation of an occurring oscillation.

In one advantageous specific embodiment of the present invention, the ascertainment circuit is configured to block the connection of the suppression circuit outside the at least one time window. Erroneous activations are reduced as a result of the active blocking of the connection.

In one advantageous specific embodiment of the present invention, the ascertainment circuit is configured to position the at least one time window around the bit boundary in such a way that the time window starts maximally 20% of a bit time, in particular, maximally 10% of the bit time before the bit boundary and ends maximally 50% of the bit time, in particular, maximally 30% of the bit time after the bit boundary. The asymmetry around the bit boundary accounts for the fact that the probability of occurrence of the state transition is greater after the ascertained bit boundary than before the bit boundary.

In one advantageous specific embodiment of the present invention, the ascertainment circuit is configured to limit an activation time period of the increased attenuation of the oscillation of the voltage by the suppression circuit to below 50% of the bit time, in particular to below 30% of the bit time. A greater proportion of the bit time is advantageously blocked as a result, which reduces the probability of an erroneous activation.

In one advantageous specific embodiment of the present invention, the circuit includes: a measuring circuit, which is configured to ascertain a time offset between a transmission of a transmit input signal and a reception of the received output signal corresponding thereto; and the ascertainment circuit, which is configured to shift the ascertained time window as a function of the ascertained time offset. With the time offset, a signal propagation time through the circuit and the bus system is advantageously ascertained. The time offset is used to shift the ascertained time window in such a way that a high probability of occurrence of an edge change is given. The time window, and thus the identification of the state transition, is advantageously dynamically adapted to the present configuration of the bus system.

In one advantageous specific embodiment of the present invention, the ascertainment circuit is configured to ascertain a data phase as a function of the absolute difference of the voltage between the two bus-side terminals, and to ascertain the time window only within the data phase. This advantageously excludes an influencing of the arbitration phase by the added suppression circuit. This is advantageous, in particular, if the data phase exhibits a higher data rate than the arbitration phase. At higher data rates, in particular, the attenuation via the short-term connection of the suppression circuit is advantageous.

In one advantageous specific embodiment of the present invention, the ascertainment circuit is configured to ascertain an arbitration phase and the data phase as a function of a profile of the absolute difference of the voltage between the two bus-side terminals, and to ascertain the time window during the arbitration phase to be larger than in the data phase. In this way, the time window, and thus the connection of the suppression circuit, is therefore adapted to the potentially different bit rates in the arbitration phase and the data phase.

One further aspect of the present invention relates to a transceiver for a user station of a bus system, the transceiver encompassing the circuit according to the first aspect.

One further aspect of the present invention relates to a method for operating a circuit for a bus system, the method including: ascertaining a first state in which an absolute difference of a voltage between two bus-side terminals is above a threshold value; ascertaining a second state in which the absolute difference of a voltage between two bus-side terminals is below a threshold value; ascertaining a bit boundary as a function of a number of state transitions between the first and second state; and connecting a suppression circuit between the two bus-side connections before the bit boundary.

DETAILED DESCRIPTION OF EXAMPLE EMBODIMENTS

Figure 1:
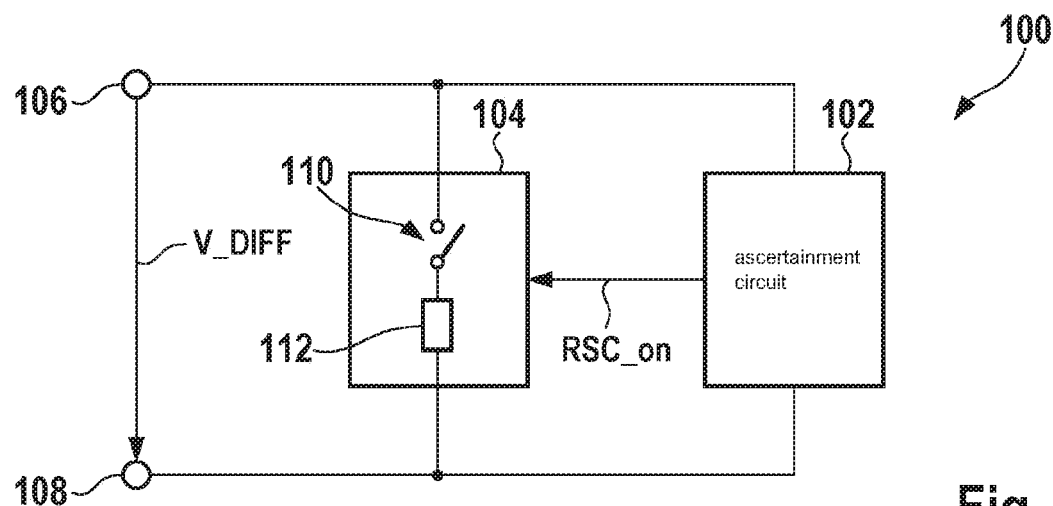
FIGS. 1 and 2 show a circuit in schematic form in accordance with an example embodiment of the present invention.

FIG. 1 shows a circuit 100 for a bus system in accordance with an example embodiment of the present invention.

Circuit 100 includes an ascertainment circuit 102 and a suppression circuit 104, which are situated in parallel to one another between two bus-side terminals 106 and 108. Circuit 100 is connected via terminal 106 to a first bus line CAN_H. Circuit 100 is connected via terminal 108 to a second bus line CAN_L. Ascertainment circuit 102 ascertains at least two states as a function of a voltage V_DIFF, which drops between the two terminals 106 and 108. A first state is reached, for example, when an absolute value of voltage V_DIFF is above a threshold value. A second state is reached when the absolute value of voltage V_DIFF is below the aforementioned threshold value or a different threshold value. If the bus system is a CAN bus (CAN: Controller Area Network), then the first state is referred to as dominant and the second state is referred to as recessive. A bit boundary, i.e., a point in time of a possible or actual transition between the two states, is ascertained as a function of state transitions between the two aforementioned states. A time window is ascertained as a function of the ascertained bit boundary, the time window in each case including only one of the bit boundaries. Suppression circuit 104 may be activated with the aid of a signal RSC_on as long as the aforementioned time window is active.

Ascertainment circuit 102 is designed, for example, as an ASIC, FPGA or as a discrete circuit. Ascertainment circuit 102 also includes a processor, for example, which is equipped with software in order to carry out the respective functions defined by the software. Mixed forms encompassing a physical circuit and the processor on which the software is executed are, of course, also possible. The software is stored on a corresponding memory element. Circuit 100 is, for example, part of a transceiver for a user station of a bus system. In another specific embodiment, circuit 100 is designed in addition to an existing transceiver.

Suppression circuit 104 is provided for reducing differential voltage V_DIFF during the transition from dominant to recessive. Suppression circuit 104, depicted in schematic form, includes, for example, a switch 110 and a resistor 112 situated in series relative thereto. This resistor 112 is operated, for example, with different resistance values or impedance values. Suppression circuit 104 may, of course, also be differently designed and may include, for example, a MOSFET, a diode, or other components having a linear or non-linear behavior, in order to reduce the differential voltage during the transition from dominant to recessive. Resistor 112 is switched during the time window between the two bus-side terminals 106, 108. As a result, resistor 112 is not activated outside the at least one ascertained time window, i.e., is disconnected. Thus, a blocking of the connection of resistor 112 between the two terminals 106 and 108 takes place outside the at least one time window. If the at least one time window ends, resistor 112 is disconnected as a function of signal RSC_on.

Figure 2:
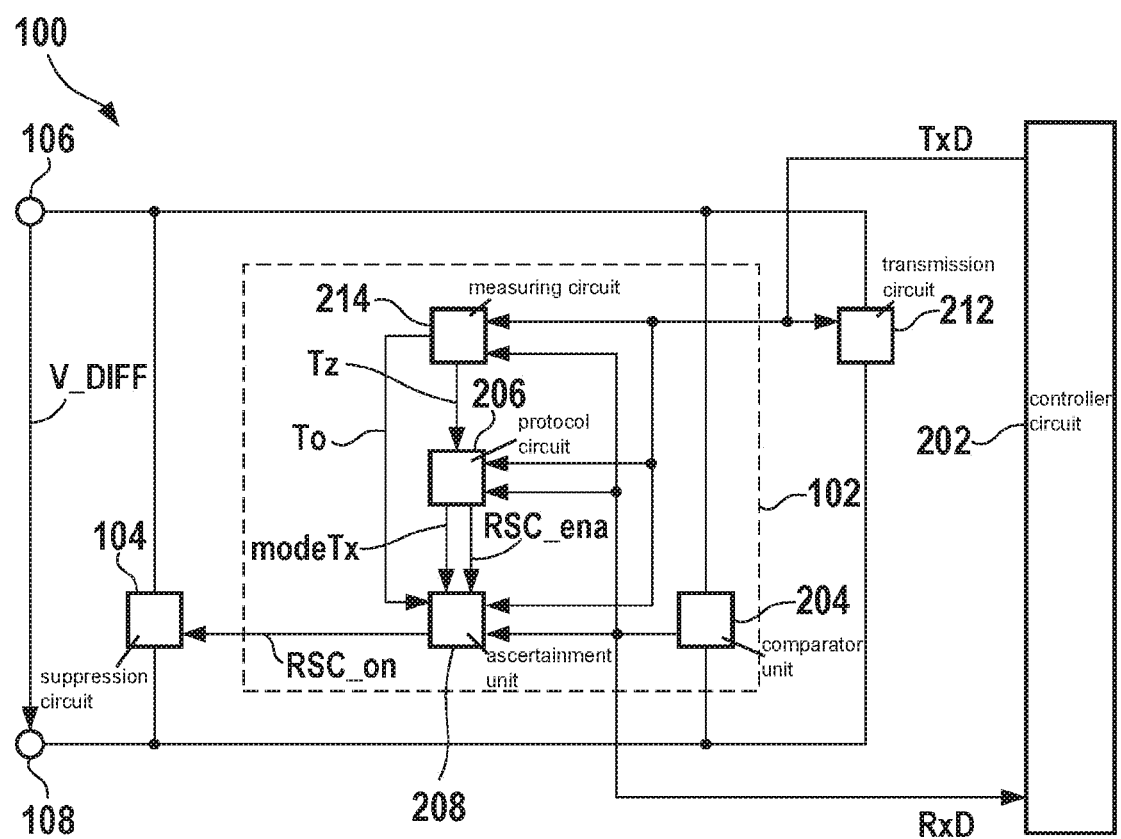

FIG. 2 shows circuit 100 in a schematic form in accordance with an example embodiment of the present invention. A controller circuit 202 generates a transmit input signal TxD and receives a received output signal RxD of circuit 100. Received output signal RxD is ascertained by a comparator unit 204 of ascertainment circuit 102 as a function of voltage V_DIFF. Circuit 100 in the example shown uses comparator unit 204 of the actual transceiver. In another example not shown, circuit 100 includes a separate comparator unit, which operates particularly fast, for example, or uses other threshold values. A protocol unit 206 interprets the received output signal RxD to the extent that the bit boundary is ascertained. The bit boundary is a point in time returning at regular intervals, characterized by frequency and phase, the bit boundary in CAN being ascertained, for example, with the aid of a simplified CAN protocol controller as a function of received output signal RxD. Protocol unit 206 determines the at least one time window, which includes the bit boundary, as a function of the bit boundary. A respective time window RSC_ena, in particular, is ascertained for each bit boundary, provided the start of time window RSC_ena coincides with the presence of the first state (dominant).

An ascertainment unit 208 ascertains as a function of received output signal RxD whether a state change of voltage V_DIFF from the first state into the second state is present. If this is the case and time window RSC_ena is present, the resistor of suppression circuit 104 is switched with the aid of generated signal RSC_on between the two terminals 106 and 108. This means that as long as time window RSC_ena is active, a release for the connection of the resistor of suppression circuit 104 is present. If the release expires, i.e., ends time window RSC_ena, the resistor is then disconnected either after the lapse of the connection time period or at the end of the time window RSC_ena. Protocol unit 206 positions time window RSC_ena, for example, symmetrically around the bit boundary. Protocol unit 206 positions time window RSC_ena preferably, however, asymmetrically relative to the bit boundary, the time window beginning, for example, maximally 20%, in particular, maximally 10% of a bit time, i.e., of a time period between two adjacent bit boundaries, before each bit boundary. The asymmetrical positioning of the time window encompasses time window RSC_ena ending maximally 50% of the bit time, in particular, maximally 30% of the bit time after the associated bit boundary. Time window RSC_ena encompasses, in particular, a maximum of one bit boundary. The duration of the activation of the resistor is limited to 50% of the bit time, in particular, to 30% of the bit time, but encompasses at least 10% of the bit time. For example, time window RSC_ena is activated 20% of the bit time before the bit boundary and deactivated 50% of the bit time after the bit boundary or is activated 10% of the bit time before the bit boundary and is deactivated 30% of the bit time after the bit boundary.

Protocol unit 206 processes transmit input signal TxD and ascertains a presence of edge changes of the transmit input signal TxD. If edge changes are present and these fit the state on the bus, which is tracked via received output signal RxD, then a transmission state modeTx of circuit 100 is ascertained, which means that controller circuit 202 transmits a message. Transmit input signal TxD is fed to ascertainment unit 208, in the presence of transmission state mode Tx and in the presence of a state transition of transmission circuit 212, in order to switch from a driven operating state into a non-driven operating state, which is identified, for example, in CAN by an edge change of transmit input signal TxD from zero to one, to connect the resistor of suppression circuit 104 between the two terminals 106 and 108 with the aid of signal RSC_on. In the presence of transmission state mode Tx, ascertainment unit 208 ignores a state change of received output signal RxD within time window RSC_ena. A double triggering of the resistor in terms of connecting is thus prevented. The advantage of the combined evaluation of received output signal RxD and of transmit input signal TxD is that a reaction to the state change on the bus always rapidly takes place.

A measuring circuit 214 receives both received output signal RxD as well as transmit input signal TxD and ascertains a first time offset Tz and a second time offset To. First time offset Tz corresponds to a time period for detecting a bus state present on the bus in the form of voltage V_DIFF with the aid of comparator unit 204 and for forwarding it to protocol unit 206. Second time offset To corresponds to a time period, which begins with a change of transmit input signal TxD provided by controller circuit 202 and ends at a point in time at which bus signal 106, 108 reacts to the preceding change. Time offsets Tz, To are determined, for example, in such a way that the propagation time of an edge change in transmit input signal TxD is measured until this edge change becomes visible in received output signal RxD and from which time offsets Tz, To are derived, for example, by halving the propagation time.

Alternatively, instead of measuring, the measuring unit may also estimate time offsets Tz, To. For this purpose, the measuring unit has stored, for example, a temperature-related minimum and maximum value for time offsets Tz and To and ascertains by interpolation the values for time offsets Tz and Tz as a function of a temperature signal. For this purpose, input signals TxD and RxD are not required.

In addition, ascertainment unit 208 also processes time offset To in order, as a function of its value, to slow signal RSC_on in the event that signal mode Tx is set. This results in suppression circuit 104 being activated only when transmission circuit 212 no longer actually actively drives the bus. In other words, the propagation time differences of the individual circuit parts are thus taken into account in order to achieve an improved result.

Protocol unit 206 interprets received output signal RxD as a function of the protocol used and ascertains the presence of a data phase as a function of voltage V_DIFF and then forwards time window RSC_ena to ascertainment unit 208 only when the data phase is present. Furthermore, a distinction is made between an arbitration phase and the data phase and the at least one time window is selected to be smaller for the data phase than the at least one time window for the arbitration phase.

Figure 3:
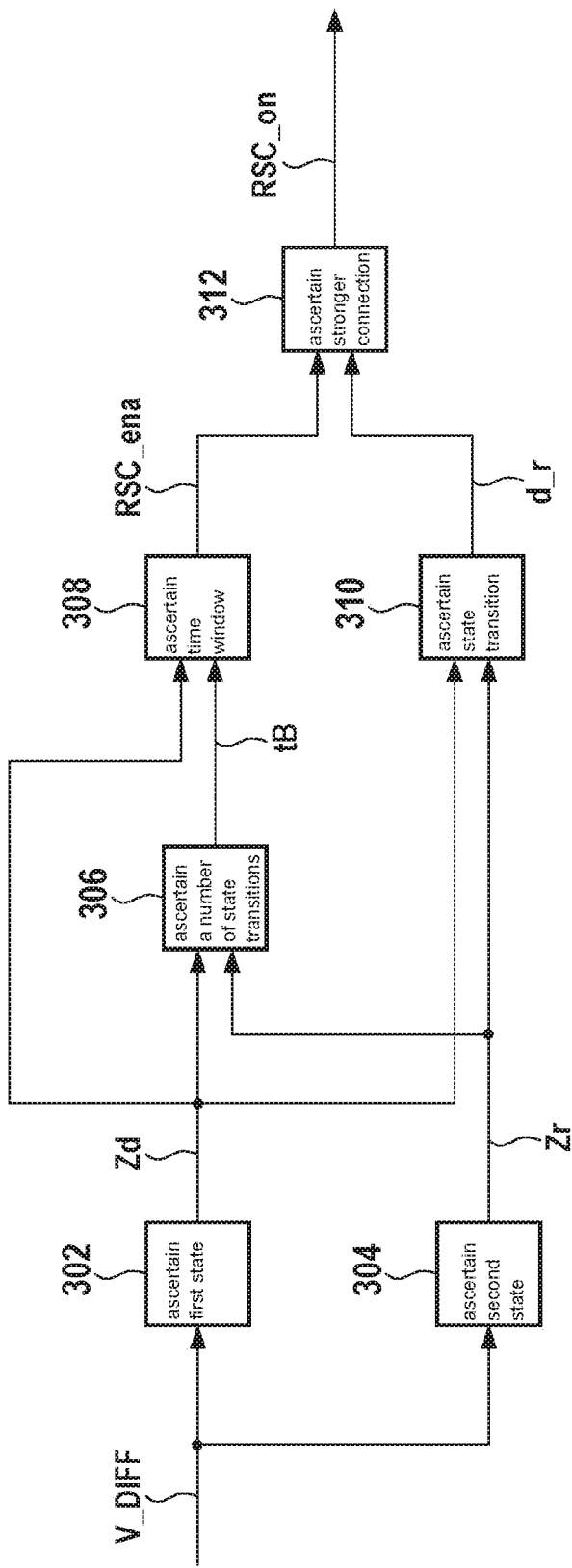
FIG. 3 schematically shows a block diagram in accordance with an example embodiment of the present invention.

FIG. 3 schematically shows a block diagram 300 for operating ascertainment circuit 102 in accordance with an example embodiment of the present invention. First state Zd is ascertained according to a block 302. Second state Zr is ascertained according to a block 304. A block 306 ascertains a number of state transitions as a function of fed states Zd and Zr and is synchronized to the state transitions so that a bit boundary tB is ascertained, which is output, for example, in the form of a clock generator signal. A block 308 ascertains time window RSC_ena including one of the ascertained bit boundaries tB and outputs time window RSC_ena if first state Zd is present at the start of the ascertained time window. A block 312 connects the resistor at the start of time window RSC-ena and disconnects it at the end of time window RSC_ena.

An optional block 310 ascertains state transition d r from first state Zd into second state Zr. If optionally ascertained state transition d r falls into time window RSC_ena, then block 312 ascertains a stronger connection of the resistor—i.e., a connection of a smaller resistor—between the two bus-side terminals of the circuit during time window RSC_ena.

Figure 4:
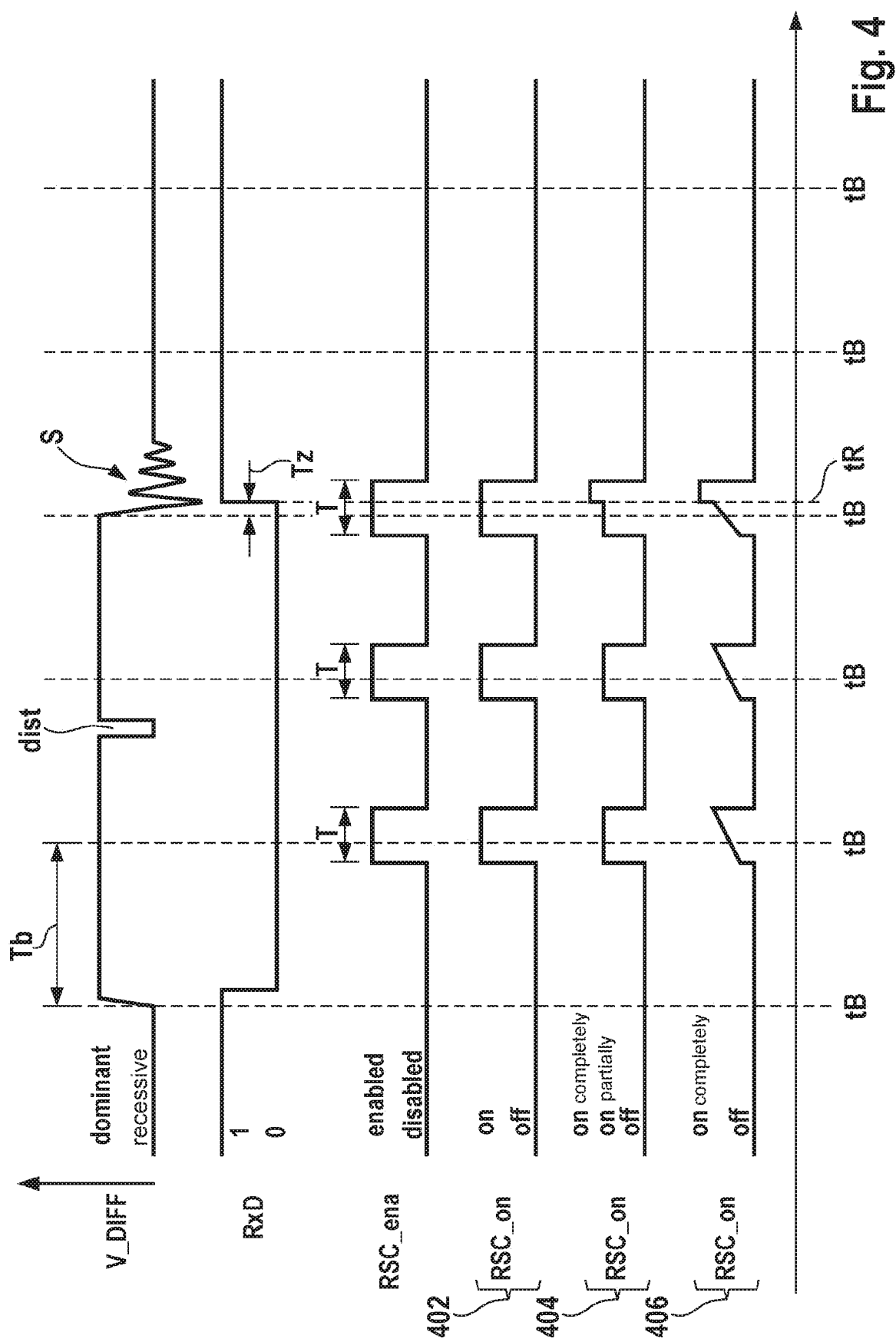
FIG. 4 schematically shows a signal-time diagram in accordance with an example embodiment of the present invention.

FIG. 4 schematically shows a signal-time diagram in accordance with an example embodiment of the present invention. A transition of voltage V_DIFF from the second state (recessive level) to the first state (dominant level) and back is shown. During the return from the first state into the second state, undesirable oscillations S may occur. In order to attenuate these, the resistor of the suppression circuit is switched between the two bus-side terminals during time window RSC_ena for connection time period T, which is depicted according to an exemplary profile 402. Outside release time period T, a disturbance dist of voltage V_DIFF, which could be falsely interpreted as a state transition, does not result in the connection of the resistor.

Alternatively, according to one exemplary profile 404, in the event a rising edge in received output signal RxD is established at a point in time tR, the resistance value of the resistor is changed from a first resistance value to a second resistance value, which is lower than the first resistance value. If no rising edge of the received output signal occurs during connection time period T, then the resistance value remains at the first resistance value.

Alternatively, according to one exemplary profile 406, the resistance value is lowered over time, i.e., the connection is increased. If during this increase the rising edge in received output signal RxD is established at a point in time tR, the resistance value of the resistor is lowered to the second resistance value, which is lower than the first resistance value. If no rising edge of the received output signal occurs during connection time period T, the resistance value is then lowered further. The lowering of the resistance value over time may encompass a gradual lowering or a continuous, in particular, linear lowering.

Bit time Tb between two adjacent bit boundaries tB is also shown. Also shown is time offset Tz between the ascertainment of a rising edge of received output signal RxD and the ascertainment of bit boundary tB.

Figure 5:
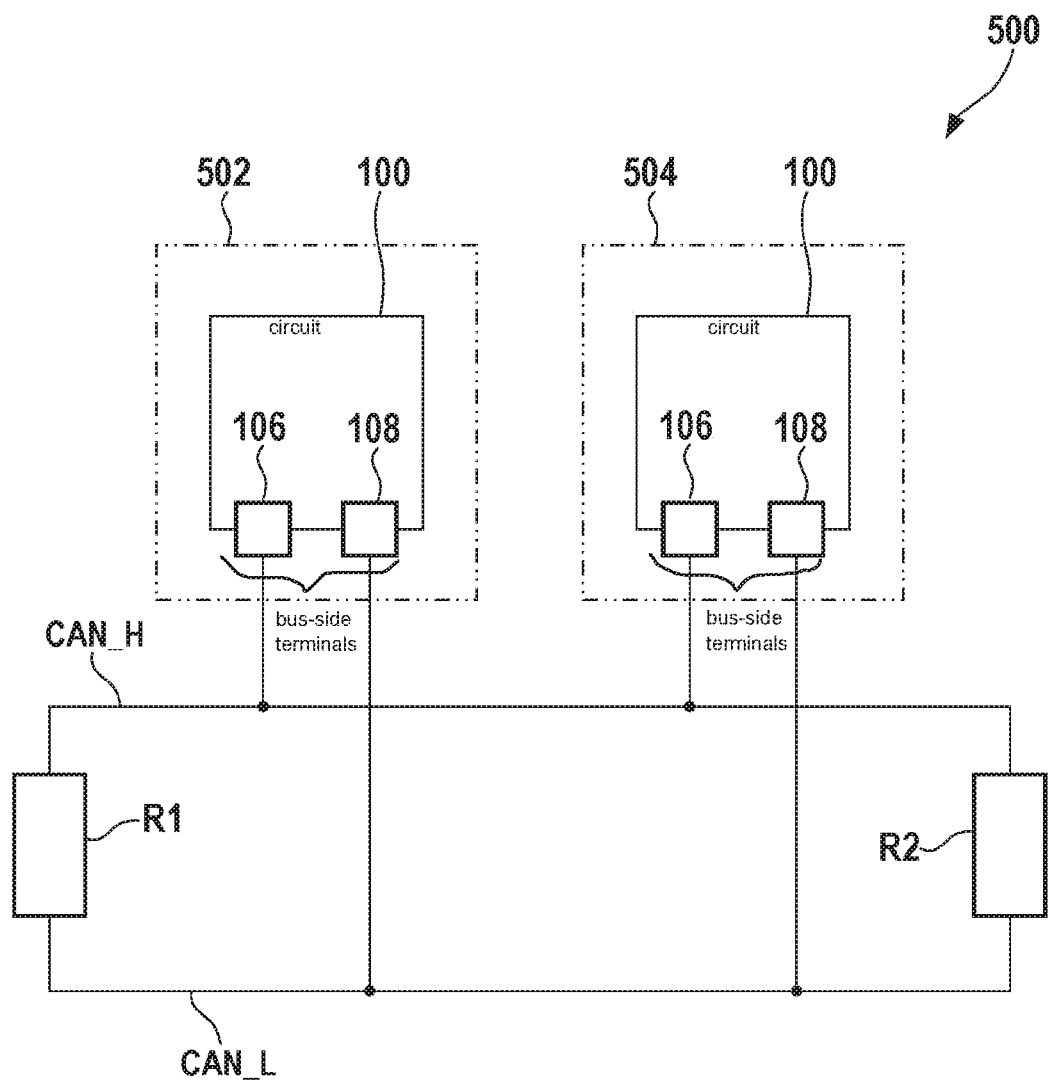
FIG. 5 shows an exemplary bus system in schematic form in accordance with an example embodiment of the present invention.

FIG. 5 shows a bus system configured by way of example, including two user stations 502, 504, in accordance with an example embodiment of the present invention. Each of user stations 502, 504 includes respective circuit 100, which is connected with first terminal 106 to first bus line CAN_H and with second terminal 108 to second bus line CAN_L. Bus lines CAN_H and CAN_L are interconnected at their ends via a respective terminating resistor R1 and R2. Activating/deactivating the suppression circuit between bus-side terminals 106, 108 causes respective circuits 100 of user stations 502 and 504 to attenuate and therefore reduce oscillations during a state change from dominant to recessive. Bus system 500 according to the exemplary embodiments operates according to the CAN standard such as, for example, ISO11898. Circuit 100 and the operation of the circuit may, however, also be readily applied to other bus systems. Moreover, other bus topologies are also possible.

What is claimed is:

1. A circuit for a bus system, the circuit comprising:
   an ascertainment circuit configured to ascertain a first state in which an absolute difference of a voltage between two bus-side terminals is above a threshold value, ascertain a second state in which the absolute difference of the voltage between the two bus-side terminals is below a threshold value, and ascertain a bit boundary as a function of a number of state transitions between the first and second state; and
   a suppression circuit switchable between the two bus-side terminals before the ascertained bit boundary.

2. The circuit as recited in claim 1, wherein the ascertainment circuit is configured to ascertain at least one time window, a start of the time window being situated before the bit boundary and an end of the time window being situated after the bit boundary, and wherein the suppression circuit is connectable between the two bus-side terminals at the start of the time window and being disconnectable at the end of the time window.

3. The circuit as recited in claim 2, wherein the suppression circuit is configured to increase an attenuation of an oscillation of the voltage between two bus-side terminals when a state transition from the first state into the second state occurs within the ascertained time window.

4. The circuit as recited in claim 2, wherein the suppression circuit is configured to be switched with at least two different impedance values between the two bus-side terminals, and to lower the impedance value of the suppression circuit when a state transition from the first state into the second state occurs within the ascertained time window.

5. The circuit as recited in claim 4, wherein the suppression circuit is configured to hold the impedance value constant until the ascertainment of the state transition.

6. The circuit as recited in claim 4, wherein the suppression circuit is configured to lower the impedance value over time at least until the ascertainment of the state transition.

7. The circuit as recited in claim 2, wherein the ascertainment circuit is configured to block the connection of the suppression circuit outside the at least one time window.

8. The circuit as recited in claim 2, wherein the ascertainment circuit is configured to position the at least one time window around the bit boundary in such a way that the time window begins maximally 20% of a bit time before the bit boundary and ends maximally 50% of the bit time after the bit boundary.

9. The circuit as recited in claim 2, wherein the ascertainment circuit is configured to position the at least one time window around the bit boundary in such a way that the time window begins maximally 10% of a bit time before the bit boundary and ends maximally 30% of the bit time after the bit boundary.

10. The circuit as recited in claim 3, wherein the ascertainment circuit is configured to limit an activation time period of the attenuation of the oscillation of the voltage by the suppression circuit to below 50% of a bit time.

11. The circuit as recited in claim 3, wherein the ascertainment circuit is configured to limit an activation time period of the attenuation of the oscillation of the voltage by the suppression circuit to below 30% of a bit time.

12. The circuit as recited in claim 2, the circuit further comprising:
    a measuring circuit configured to ascertain a time offset between a transmission of a transmit input signal and reception of a received output signal corresponding to the transmit input signal; and
    an ascertainment circuit configured to shift the ascertained time window as a function of the ascertained time offset.

13. The circuit as recited in claim 2, wherein the ascertainment circuit is configured to ascertain a data phase as a function of the absolute difference of the voltage between the two bus-side terminals, and ascertain the time window only within the data phase.

14. The circuit as recited in claim 13, wherein the ascertainment circuit is configured to ascertain an arbitration phase and the data phase as a function of a profile of the absolute difference of the voltage between the two bus-side terminals, and ascertain the time window during the arbitration phase to be larger than in the data phase.

15. A transceiver for a user station of a bus system, the transceiver comprising:
    a circuit for a bus system, the circuit including:
        an ascertainment circuit configured to ascertain a first state in which an absolute difference of a voltage between two bus-side terminals is above a threshold value, ascertain a second state in which the absolute difference of the voltage between the two bus-side terminals is below a threshold value, and ascertain a bit boundary as a function of a number of state transitions between the first and second state; and
a suppression circuit switchable between the two bus-side terminals before the ascertained bit boundary.

16. A method for operating a circuit for a bus system, the method comprising the following steps:
ascertaining a first state in which an absolute difference of a voltage between two bus-side terminals is above a threshold value;
ascertaining a second state in which the absolute difference of the voltage between the two bus-side terminals is below a second threshold value;
ascertaining a bit boundary as a function of a number of state transitions between the first state and the second state; and
connecting a suppression circuit between the two bus-side terminals before the bit boundary.

17. A circuit for a bus system, the circuit comprising:
a suppression circuit that is switchable between an inactive state and an active state between two bus-side terminals of the bus system and that, when the suppression circuit is in the active state, is configured to perform a signal suppression, wherein the suppression circuit cannot perform the signal suppression when the suppression circuit is not in the active state; and
an ascertainment circuit configured to:
determine bit boundaries between which a transition between (a) a first state of the bus system in which an absolute difference of a voltage between the two bus-side terminals is above a threshold value and (b) a second state of the bus system in which the absolute difference of the voltage between the two bus-side terminals is not above the threshold value is expected not to occur; and
based on the determination of the bit boundaries, prevent the suppression circuit from being in the active state in periods that are between the bit boundaries.

18. The circuit as recited in claim 17, wherein the periods are between time windows that are each a predefined amount of time within which a respective single one of the bit boundaries occurs.

19. The circuit as recited in claim 18, wherein the windows are defined by a first predefined amount of time before respective ones of the bit boundaries and a second predefined amount of time after the respective ones of the bit boundaries.

20. The circuit as recited in claim 19, wherein the second predefined amount of time does not equal the first predefined amount of time.

21. The circuit as recited in claim 17, wherein the signal suppression is a signal attenuation.

22. The circuit as recited in claim 17, wherein the ascertainment circuit is configured to detect a transition from the first state to the second state and respond to the detection of the transition by triggering the suppression circuit to enter into the active state conditional upon that the detection does not occur during the periods that are between the bit boundaries.

23. The circuit as recited in claim 22, wherein the signal suppression is an attenuation of a voltage oscillation between the two bus-side terminals that occurs during the transition from the first state to the second state.

24. The circuit as recited in claim 17, wherein the ascertainment circuit is configured to detect transitions between the first state of the bus system and the second state of the bus system and is configured to determine the bit boundaries based on a number of the detected transitions.

* * * * *